US012377654B2

(12) United States Patent
Takabe et al.

(10) Patent No.: US 12,377,654 B2
(45) Date of Patent: Aug. 5, 2025

(54) PIEZOELECTRIC ACTUATOR AND MANUFACTURING METHOD THEREOF, LIQUID DROPLET DISCHARGE HEAD, AND ULTRASONIC DEVICE

(71) Applicant: SEIKO EPSON CORPORATION, Tokyo (JP)

(72) Inventors: Motoki Takabe, Shiojiri (JP); Eiju Hirai, Azumino (JP)

(73) Assignee: SEIKO EPSON CORPORATION (JP)

( * ) Notice: Subject to any disclaimer, the term of this patent is extended or adjusted under 35 U.S.C. 154(b) by 189 days.

(21) Appl. No.: 18/308,097

(22) Filed: Apr. 27, 2023

(65) Prior Publication Data

US 2023/0347647 A1 Nov. 2, 2023

(30) Foreign Application Priority Data

Apr. 28, 2022 (JP) ................. 2022-075340

(51) Int. Cl.
*B41J 2/14* (2006.01)
*B41J 2/16* (2006.01)
(Continued)

(52) U.S. Cl.
CPC .......... *B41J 2/14201* (2013.01); *H10N 30/06* (2023.02); *H10N 30/082* (2023.02);
(Continued)

(58) Field of Classification Search
CPC .... B41J 2/14201; B41J 2/1607; B41J 2/1626; B41J 2/161; B41J 2/1628; B41J 2/1629; B41J 2/1631; B41J 2/1646; B41J 2/14233; H10N 30/06; H10N 30/082; H10N 30/2047; H10N 30/87; H10N 30/883; H10N 39/00;
(Continued)

(56) References Cited

FOREIGN PATENT DOCUMENTS

EP 3205501 A1 8/2017
JP 2008-230139 A 10/2008
(Continued)

OTHER PUBLICATIONS

Shingyouchi Mitsuru et al., "Droplet Discharge Head and Image Formation Device" (JP 2014058126), Apr. 3, 2014, [Description of Embodiments, Paragraphs 0012-0013 and 0019]. (Year: 2014).*

*Primary Examiner* — Lisa Solomon
(74) *Attorney, Agent, or Firm* — Harness, Dickey & Pierce, P.L.C.

(57) ABSTRACT

A piezoelectric actuator includes a substrate, and a first piezoelectric device and a second piezoelectric device formed at the substrate. The first piezoelectric device includes a first lower electrode, a first piezoelectric body, and a first upper electrode. The second piezoelectric device includes a second lower electrode, a second piezoelectric body, and a second upper electrode. A side surface of the first lower electrode is not covered with the first piezoelectric body, and a side surface of the second lower electrode is not covered with the second piezoelectric body. The piezoelectric actuator further includes a common electrode formed at the substrate and coupled to the first upper electrode and the second upper electrode, and an insulating layer located between the common electrode and the first lower electrode and between the common electrode and the second lower electrode.

7 Claims, 8 Drawing Sheets

(51) Int. Cl.
*H10N 30/06* (2023.01)
*H10N 30/082* (2023.01)
*H10N 30/20* (2023.01)
*H10N 30/87* (2023.01)
*H10N 30/88* (2023.01)
*H10N 39/00* (2023.01)

(52) U.S. Cl.
CPC ......... *H10N 30/2047* (2023.02); *H10N 30/87* (2023.02); *H10N 30/883* (2023.02); *H10N 39/00* (2023.02); *B41J 2/1607* (2013.01); *B41J 2/1626* (2013.01)

(58) Field of Classification Search
CPC .. H10N 30/875; H10N 30/204; H10N 30/872; B05B 17/0607; B05B 17/0653; B06B 1/0629
See application file for complete search history.

(56) References Cited

FOREIGN PATENT DOCUMENTS

| | | | |
|---|---|---|---|
| JP | 2010-208137 A | | 9/2010 |
| JP | 2014058126 A | * | 4/2014 |
| WO | 2014/003768 A1 | | 1/2014 |

* cited by examiner

PIEZOELECTRIC ACTUATOR AND MANUFACTURING METHOD THEREOF, LIQUID DROPLET DISCHARGE HEAD, AND ULTRASONIC DEVICE The present application is based on, and claims priority from JP Application Serial Number 2022-075340, filed Apr. 28, 2022, the disclosure of which is hereby incorporated by reference herein in its entirety.

BACKGROUND

1. Technical Field

The present disclosure relates to a piezoelectric actuator and a manufacturing method of the piezoelectric actuator, a liquid droplet discharge head, and an ultrasonic device.

2. Related Art

In the related art, for example, as disclosed in JP-A-2010-208137, there has been known a liquid droplet discharge head that includes, on a first conductive layer (lower electrode) that is individually patterned, a piezoelectric layer covering the first conductive layer and a second conductive layer covering the piezoelectric layer.

In JP-A-2010-208137, after a metal film is formed on a vibrating plate, etching is performed to form the lower electrode that is individually patterned, and then the piezoelectric layer that covers the lower electrode is formed. In such a manufacturing method, when a component of an etching solution or a resist remains on the lower electrode in patterning the lower electrode, a defect may occur in the piezoelectric layer formed on the lower electrode, which may cause a decrease in yield. In addition, orientation of a piezoelectric body crystal-growing from a top surface of the vibrating plate and orientation of a piezoelectric body crystal-growing from a top surface of the lower electrode may be different from each other, and cracks may be generated in the piezoelectric layer around an end edge portion of the lower electrode, or a portion in which the crystal orientation is disturbed may be formed.

SUMMARY

According to one aspect of the present disclosure, there is provided a piezoelectric actuator including a substrate, and a first piezoelectric device and a second piezoelectric device formed at the substrate. The first piezoelectric device includes a first lower electrode formed at the substrate, a first piezoelectric body formed at the first lower electrode, and a first upper electrode formed at the first piezoelectric body. The second piezoelectric device includes a second lower electrode formed at the substrate in a region different from the first lower electrode, a second piezoelectric body formed at the second lower electrode, and a second upper electrode formed at the second piezoelectric body. A side surface of the first lower electrode is not covered with the first piezoelectric body, and a side surface of the second lower electrode is not covered with the second piezoelectric body. The piezoelectric actuator further includes a common electrode formed at the substrate and coupled to the first upper electrode and the second upper electrode, and an insulating layer located between the common electrode and the first lower electrode and between the common electrode and the second lower electrode.

According to an aspect of the present disclosure, there is provided a manufacturing method of a piezoelectric actuator, the method including: preparing a substrate; forming a lower electrode at the substrate; forming a piezoelectric body at the lower electrode; an etching step of etching the lower electrode and the piezoelectric body to form a laminated film of a first lower electrode and a first piezoelectric body and a laminated film of a second lower electrode and a second piezoelectric body at different positions at the substrate; forming an insulating layer covering at least a portion of a side surface of the first lower electrode and at least a portion of a side surface of the second lower electrode; and forming a common electrode at the first piezoelectric body, the second piezoelectric body, and the insulating layer.

DESCRIPTION OF EXEMPLARY EMBODIMENTS

Figure 1:
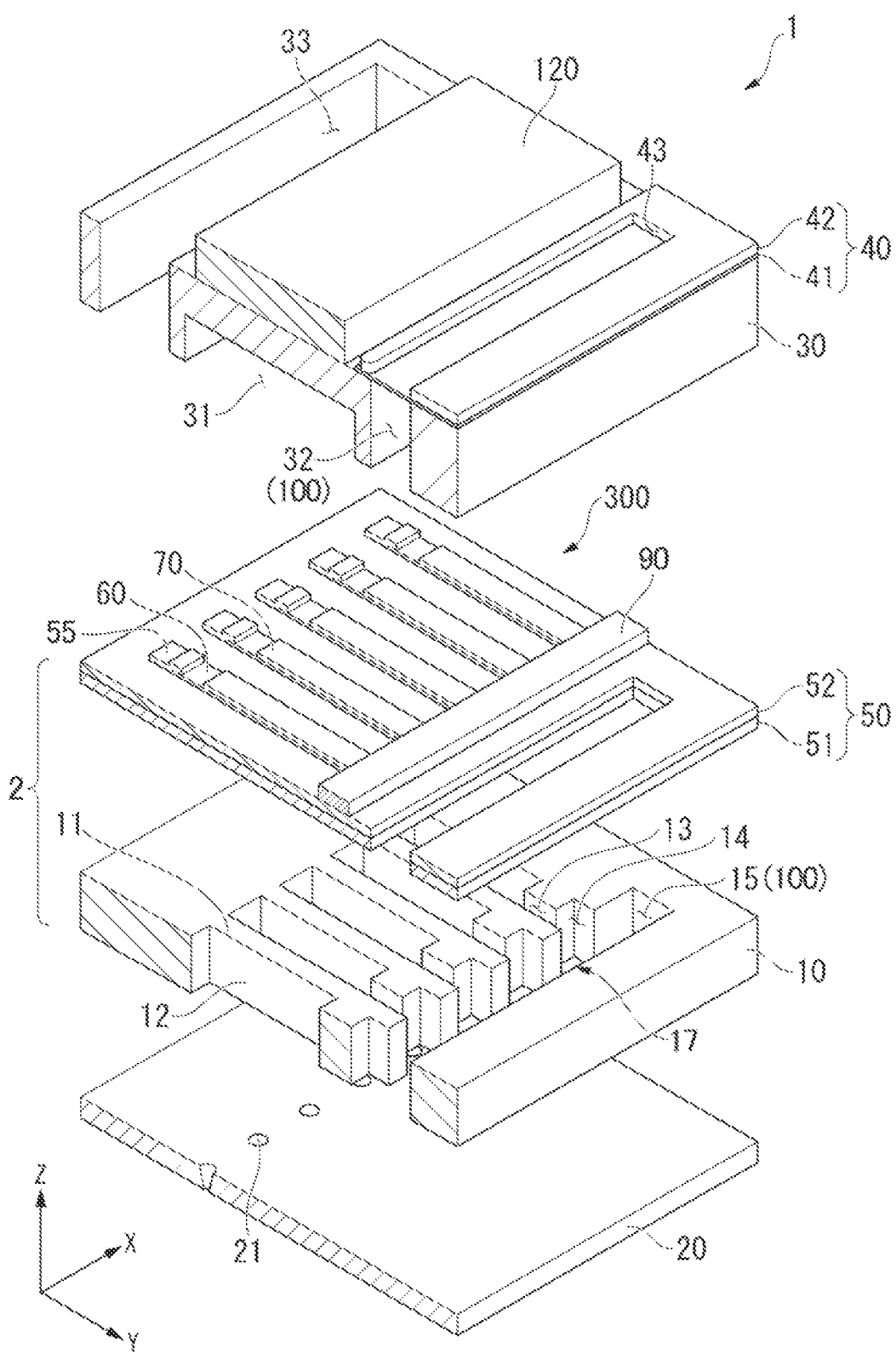
FIG. 1 is an exploded perspective view schematically illustrating a liquid droplet discharge head according to an embodiment.

Hereinafter, an embodiment of the present disclosure will be described with reference to the drawings. The following description shows an aspect of the present disclosure, and can be freely changed within the scope of the present disclosure. In the drawings, members denoted by the same reference signs indicate the same members, and a description thereof is omitted appropriately. In the drawings, X, Y, and Z represent three spatial axes orthogonal to each other. In the present specification, directions along these axes will be described as an X-axis direction, a Y-axis direction, and a Z-axis direction, respectively. The Z-axis direction represents a thickness direction or a lamination direction of a plate, a layer, and a film. The X-axis direction and the Y-axis direction represent in-plane directions of a plate, a layer, and a film.

Liquid Droplet Discharge Head

A liquid droplet discharge head according to the embodiment will be described with reference to the drawings.

Figure 2:
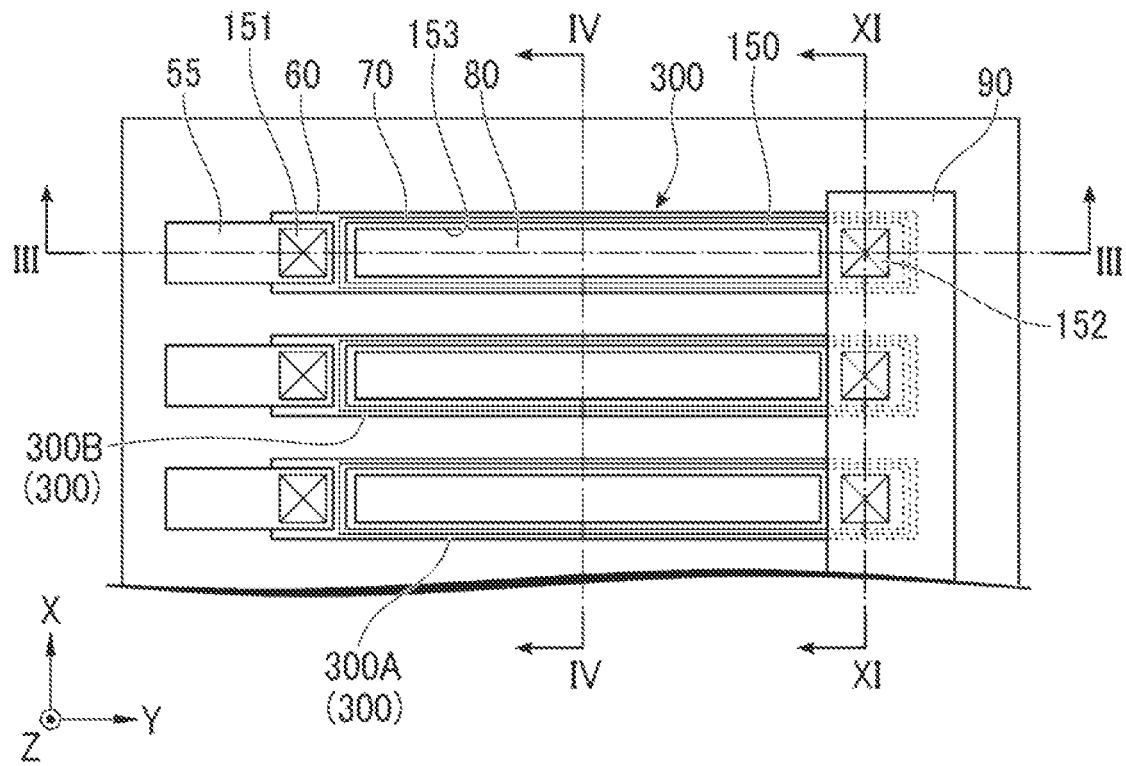
FIG. 2 is a partial plan view schematically illustrating a piezoelectric actuator provided in the liquid droplet discharge head of the embodiment.
Figure 3:
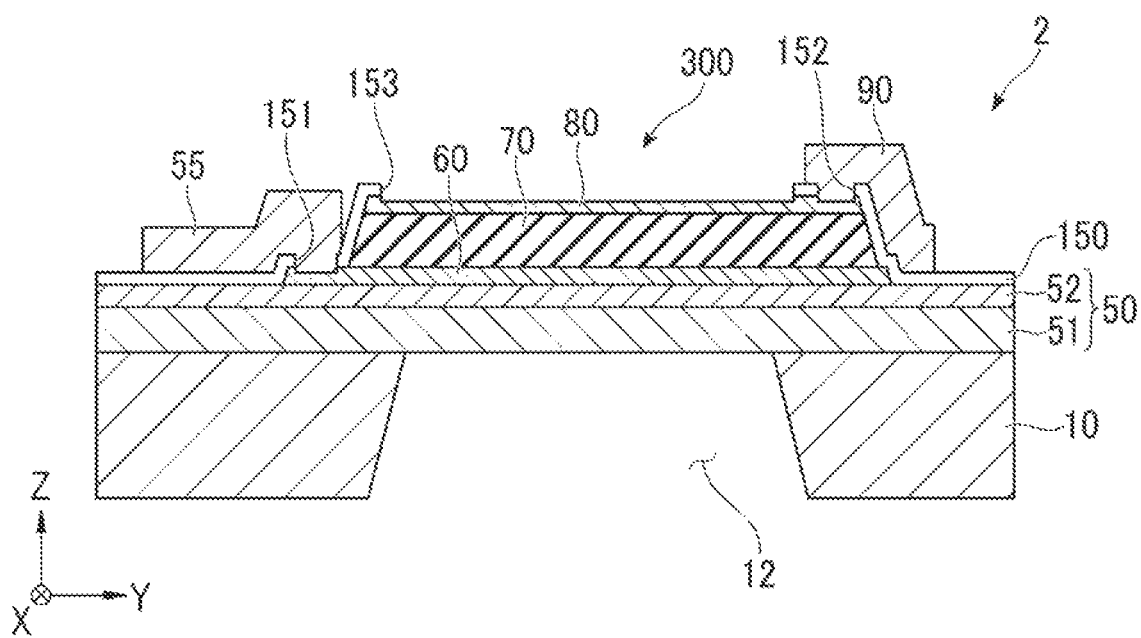
FIG. 3 is a cross-sectional view taken along a line III-III in FIG. 2.
Figure 4:
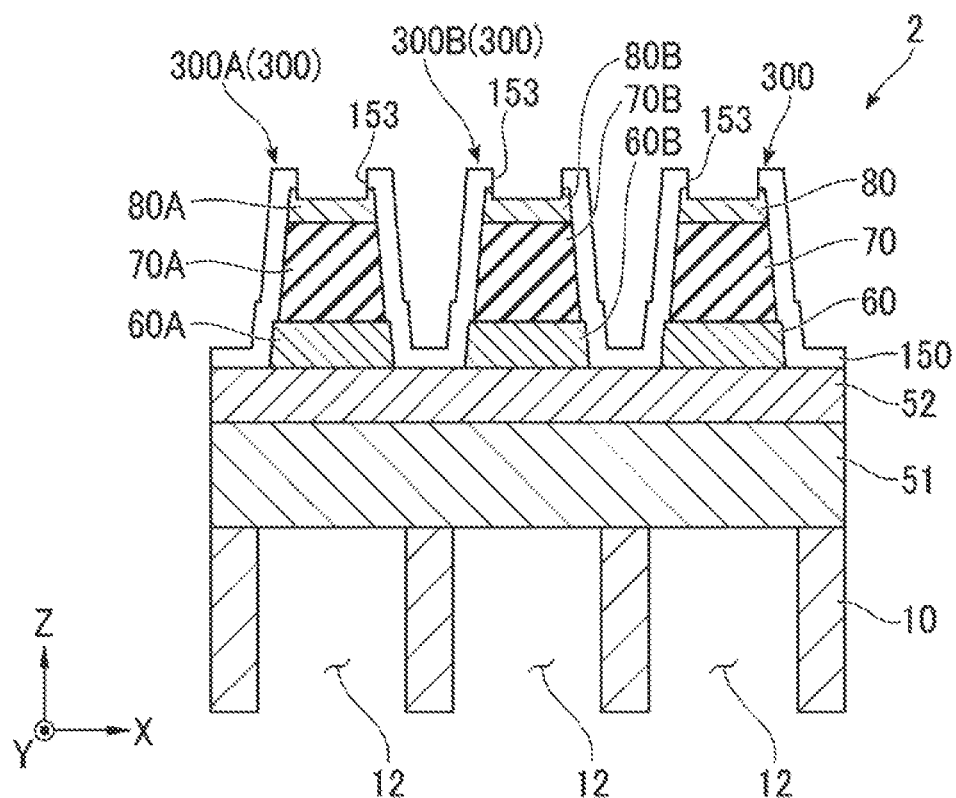
FIG. 4 is a cross-sectional view taken along a line IV-IV in FIG. 2.

FIG. 1 is an exploded perspective view schematically illustrating the liquid droplet discharge head of the embodiment. FIG. 2 is a partial plan view schematically illustrating a piezoelectric actuator provided in the liquid droplet discharge head of the embodiment. FIG. 3 is a cross-sectional view taken along a line III-III in FIG. 2. FIG. 4 is a cross-sectional view taken along a line IV-IV in FIG. 2.

As illustrated in FIGS. 1 to 4, a liquid droplet discharge head 1 includes a plurality of piezoelectric devices 300, a channel substrate 10, a nozzle plate 20, a vibrating plate 50, a protective substrate 30, a circuit substrate 120, and a compliance substrate 40. FIG. 2 shows an upper surface of the vibrating plate 50. In the embodiment, the plurality of piezoelectric devices 300 are arranged side by side along the X-axis direction. The vibrating plate 50 and the plurality of piezoelectric devices 300 constitute a piezoelectric actuator 2 of the embodiment, and the details will be described later.

The channel substrate 10 is, for example, a silicon substrate. The channel substrate 10 is provided with a plurality of pressure chambers 12. The plurality of pressure chambers 12 are arranged side by side along the X-axis direction. The pressure chambers 12 are partitioned by a plurality of partition walls 11. A volume of the pressure chamber 12 is changed by movement of the piezoelectric device 300.

In the channel substrate 10, a first communication passage 13 and a second communication passage 14 are provided at an end of each pressure chamber 12 in a +Y-axis direction. The first communication passage 13 is configured such that an opening area thereof is reduced by narrowing the end of the pressure chamber 12 in the +Y-axis direction from the X-axis direction. A width of the second communication passage 14 in the X-axis direction is, for example, the same as a width of the pressure chamber 12 in the X-axis direction. A third communication passage 15 communicating with the plurality of second communication passages 14 is provided in the +Y-axis direction of the second communication passage 14. The third communication passage 15 constitutes a part of a manifold 100. The manifold 100 serves as a common liquid chamber for the pressure chambers 12. As described above, the channel substrate 10 is provided with a supply channel 17 and the pressure chambers 12. The supply channel 17 includes the first communication passages 13, the second communication passages 14, and the third communication channel 15. The supply channel 17 communicates with the pressure chamber 12 and supplies a liquid to the pressure chamber 12.

The nozzle plate 20 is attached to a surface of the channel substrate 10 on one side. A material of the nozzle plate 20 is, for example, steel use stainless (SUS). The nozzle plate 20 is bonded to the channel substrate 10 by an adhesive, a thermal welding film, or the like. The nozzle plate 20 is provided with a plurality of nozzles 21 arranged side by side along the X-axis direction. The nozzle 21 communicates with the inside of the pressure chamber 12. From the nozzle 21, a liquid is discharged.

The vibrating plate 50 is provided at a surface of the channel substrate 10 on the other side. The vibrating plate 50 includes, for example, a silicon oxide layer 51 provided on the channel substrate 10 and a zirconium oxide layer 52 provided on the silicon oxide layer 51. The vibrating plate 50 may be a single layer of the silicon oxide layer or a single layer of the zirconium oxide layer. A thickness of the vibrating plate 50 is, for example, 0.5 μm or more and 3 μm or less.

The piezoelectric device 300 is provided on the vibrating plate 50. A plurality of piezoelectric devices 300 are provided. The number of piezoelectric devices 300 is not particularly limited. As illustrated in FIG. 3, the piezoelectric device 300 includes a lower electrode 60, a piezoelectric body 70, and an upper electrode 80.

The lower electrode 60 is provided on the vibrating plate 50. The lower electrode 60 is provided between the vibrating plate 50 and the piezoelectric body 70. A thickness of the lower electrode 60 is, for example, 3 nm or more and 300 nm or less. The lower electrode 60 is, for example, a metal layer such as a platinum layer, an iridium layer, a titanium layer, or a ruthenium layer, a conductive oxide layer thereof, a lanthanum nickel oxide ($LaNiO_3$: LNO) layer, or a strontium ruthenium oxide ($SrRuO_3$:SRO) layer. The lower electrode 60 may have a structure in which a plurality of layers exemplified above are laminated.

In the liquid droplet discharge head 1, the lower electrode 60 is configured as an independent individual electrode for each pressure chamber 12. As illustrated in FIG. 4, a width of the lower electrode 60 in the X-axis direction is smaller than the width of the pressure chamber 12 in the X-axis direction. As illustrated in FIG. 3, a length of the lower electrode 60 in the Y-axis direction is larger than a length of the pressure chamber 12 in the Y-axis direction. In the Y-axis direction, both ends of the lower electrode 60 are located to sandwich both ends of the pressure chamber 12. A lead electrode 55 is coupled to an end of the lower electrode 60 in a −Y-axis direction.

The piezoelectric body 70 is provided on the lower electrode 60. The piezoelectric body 70 is provided between the lower electrode 60 and the upper electrode 80. In the embodiment, the piezoelectric body 70 is provided on the lower electrode 60 and the vibrating plate 50. A thickness of the piezoelectric body 70 is, for example, 100 nm or more and 3 μm or less. The piezoelectric body 70 can be deformed by applying a voltage between the lower electrode 60 and the upper electrode 80.

A width of the piezoelectric body 70 in the X-axis direction is smaller than the width of the lower electrode 60 in the X-axis direction. A length of the piezoelectric body 70 in the Y-axis direction is larger than the length of the pressure chamber 12 in the Y-axis direction and smaller than the length of the lower electrode 60 in the Y-axis direction. The piezoelectric body 70 is formed only on an upper surface of the lower electrode 60. That is, the piezoelectric body 70 does not cover a side surface of the lower electrode 60.

The piezoelectric body 70 is implemented by a piezoelectric material made of a complex oxide having a perovskite structure represented by a general formula $ABO_3$. In the embodiment, lead zirconate titanate (PZT; $Pb(Zr,Ti)O_3$) is used as the piezoelectric material. By using PZT as the piezoelectric material, the piezoelectric body 70 having a relatively large piezoelectric constant d31 is obtained.

In the complex oxide having a perovskite structure represented by the general formula $ABO_3$, oxygen is 12-coordinated at an A site and oxygen is 6-coordinated at a B site to form an octahedron. In the embodiment, lead (Pb) is located at the A site, and zirconium (Zr) and titanium (Ti) are located at the B site.

The piezoelectric material is not limited to PZT described above. Other elements may be contained in the A site or the B site. For example, the piezoelectric material may be a perovskite material such as barium zirconate titanate (Ba(Zr,Ti)O$_3$), lead lanthanum zirconate titanate ((Pb, La) (Zr, Ti)O$_3$), lead zirconium titanate magnesium niobate (Pb(Zr, Ti) (Mg,Nb)O$_3$), or lead zirconate titanate niobate (Pb(Zr, Ti,Nb)O$_3$) containing silicon.

In addition, the piezoelectric material may be a material in which the content of Pb is reduced, that is, a so-called low-lead material, or a material in which Pb is not used, that is, a so-called lead-free material. When a low-lead material is used as the piezoelectric material, the amount of Pb used can be reduced. In addition, when a lead-free material is used as the piezoelectric material, Pb does not need to be used. Therefore, an impact on the environment can be reduced by using a low-lead material or a lead-free material as the piezoelectric material.

Examples of the lead-free piezoelectric material include BFO-based materials containing bismuth ferrate (BFO; BiFeO$_3$). In BFO, Bi is located at an A site, and iron (Fe) is located at a B site. Other elements may be added to BFO. For example, at least one element selected from manganese (Mn), aluminum (Al), lanthanum (La), barium (Ba), titanium (Ti), cobalt (Co), cerium (Ce), samarium (Sm), chromium (Cr), potassium (K), lithium (Li), calcium (Ca), strontium (Sr), vanadium (V), niobium (Nb), tantalum (Ta), molybdenum (Mo), tungsten (W), nickel (Ni), zinc (Zn), praseodymium (Pr), neodymium (Nd), and europium (Eu) may be added to KNN.

Another example of the lead-free piezoelectric material includes a KNN-based material containing potassium sodium niobate (KNN; KNaNbO$_3$). Other elements may be added to KNN. For example, at least one element selected from manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), argentum (Ag), magnesium (Mg), zinc (Zn), copper (Cu), vanadium (V), chromium (Cr), molybdenum (Mo), tungsten (W), nickel (Ni), aluminum (Al), silicon (Si), lanthanum (La), cerium (Ce), praseodymium (Pr), neodymium (Nd), promethium (Pm), samarium (Sm), and europium (Eu) may be added to KNN.

The piezoelectric material includes a material having a composition in which a part of an element is deficient, a material having a composition in which a part of an element is excessive, and a material having a composition in which a part of an element is substituted with another element. As long as basic characteristics of the piezoelectric body 70 do not change, a material deviated from the stoichiometric composition due to deficiency or excess, or a material in which a part of an element is substituted with another element also falls within the piezoelectric material according to the embodiment. Of course, the piezoelectric material that can be used in the embodiment is not limited to a material containing Pb, Bi, Na, K, or the like as described above.

The upper electrode 80 is provided on the piezoelectric body 70. In the embodiment, the upper electrode 80 is formed only on an upper surface of the piezoelectric body 70. That is, the upper electrode 80 does not cover a side surface of the piezoelectric body 70 or a side surface of the lower electrode 60. The upper electrode 80 is provided as an independent individual electrode for each piezoelectric device 300. A thickness of the upper electrode 80 is, for example, 3 nm or more and 300 nm or less. The upper electrode 80 is, for example, a metal layer such as an iridium layer, a platinum layer, a titanium layer, or a ruthenium layer, a conductive oxide layer thereof, a lanthanum nickel oxide layer, or a strontium ruthenium oxide layer. The upper electrode 80 may have a structure in which a plurality of layers exemplified above are laminated.

The piezoelectric device 300 may not include the upper electrode 80. That is, the piezoelectric body 70 may be directly coupled to a common electrode 90 to be described later. In this case, it is preferable to select a conductive material having excellent adhesion to the piezoelectric body 70 as a constituent material of the common electrode 90.

When the upper electrode 80 is provided as in the embodiment, the upper electrode 80 can also function as an adhesion layer between the piezoelectric body 70 and the common electrode 90. The constituent material of the common electrode 90 is less limited, and a conductive material having a low resistance can be easily used.

As illustrated in FIGS. 3 and 4, an insulating layer 150 is formed on the vibrating plate 50 so as to partially cover a laminated body of the lower electrode 60, the piezoelectric body 70, and the upper electrode 80. The insulating layer 150 is a layer made of, for example, aluminum oxide, silicon oxide, silicon nitride, or zirconium oxide. The insulating layer 150 may have a structure in which a plurality of layers exemplified above are laminated.

In the case of the embodiment, the insulating layer 150 covers side surfaces of the lower electrode 60, the piezoelectric body 70, and the upper electrode 80. The insulating layer 150 has openings penetrating the insulating layer 150 in a thickness direction at a plurality of positions on the piezoelectric device 300. Specifically, the insulating layer 150 includes a contact hole 151, a contact hole 152, and an opening 153.

The contact hole 151 is opened in the insulating layer 150 on the lower electrode 60 that protrudes in the −Y-axis direction from a lower end of the piezoelectric body 70. The contact hole 152 is opened in the insulating layer 150 located on an end portion of the upper electrode 80 in the +Y-axis direction. The opening 153 is opened in the insulating layer 150 located in a region where the upper electrode 80 and the pressure chamber 12 overlap each other in a plan view (viewed in the Z-axis direction).

The lead electrode 55 partially overlapping with the lower electrode 60 in a plan view is formed at an end portion of each piezoelectric device 300 in the −Y-axis direction. The lead electrode 55 and the lower electrode 60 are electrically coupled to each other via the contact hole 151.

The common electrode 90 extending in the X-axis direction across the plurality of piezoelectric devices 300 is formed at end portions of the plurality of piezoelectric devices 300 in the +Y-axis direction. The common electrode 90 overlaps a region including the contact hole 152 of each piezoelectric device 300 in a plan view. The common electrode 90 is electrically coupled to the upper electrode 80 via the contact hole 152.

The opening 153 is provided in a portion of the insulating layer 150 that is located on the pressure chamber 12. By partially removing the insulating layer 150 that is harder than the constituent layers of the piezoelectric device 300, it is possible to improve deformation performance of the piezoelectric device 300. The insulating layer 150 may not include the opening 153.

In the embodiment, the opening 153 is in a planar region of the upper electrode 80, and a peripheral edge portion of the upper electrode 80 is covered with the insulating layer 150. The insulating layer 150 is formed continuously from the peripheral edge portion of the upper electrode 80 to the side surface of the piezoelectric device 300. According to this configuration, since a top surface of the piezoelectric body 70 is not exposed to the outside air, it is possible to prevent entry of moisture or the like into the piezoelectric body 70, and it is possible to prevent deterioration of the piezoelectric device 300 caused by moisture or the like.

In the piezoelectric device 300, by applying a voltage between the lower electrode 60 and the upper electrode 80, it is possible to apply a voltage to the piezoelectric body 70 and deform the piezoelectric body 70. In the embodiment, the piezoelectric device 300 and the vibrating plate 50 constitute the piezoelectric actuator 2 that changes the volume of the pressure chamber 12. The vibrating plate 50 constitutes a substrate of the piezoelectric actuator 2.

In the liquid droplet discharge head 1, the vibrating plate 50 and the lower electrode 60 are displaced by deformation of the piezoelectric body 70 having electromechanical conversion characteristics. That is, in the liquid droplet discharge head 1, the vibrating plate 50 and the lower electrode 60 substantially function as a vibrating plate.

In the piezoelectric actuator 2 of the embodiment, as illustrated in FIGS. 2 to 4, the plurality of piezoelectric devices 300 are formed as independent individual devices on the vibrating plate 50. Hereinafter, a first piezoelectric device 300A and a second piezoelectric device 300B illustrated in the drawings will be specifically described. The first piezoelectric device 300A and the second piezoelectric device 300B are two piezoelectric devices 300 having a common configuration, and are distinguished from each other for convenience of description.

The first piezoelectric device 300A includes a first lower electrode 60A formed on the vibrating plate 50 (substrate), a first piezoelectric body 70A formed on the first lower electrode 60A, and a first upper electrode 80A formed on the first piezoelectric body 70A.

The second piezoelectric device 300B includes a second lower electrode 60B formed in a region different from that of the first lower electrode 60A on the vibrating plate 50 (substrate), a second piezoelectric body 70B formed on the second lower electrode 60B, and a second upper electrode 80B formed on the second piezoelectric body 70B.

A side surface of the first lower electrode 60A of the first piezoelectric device 300A is not covered with the first piezoelectric body 70A. A side surface of the second lower electrode 60B of the second piezoelectric device 300B is not covered with the second piezoelectric body 70B. The piezoelectric actuator 2 includes the common electrode 90 that is formed on the vibrating plate 50 and that is coupled to the first upper electrode 80A and the second upper electrode 80B. The piezoelectric actuator 2 includes the insulating layer 150 located between the common electrode 90 and the first lower electrode 60A and between the common electrode 90 and the second lower electrode 60B.

According to this configuration, the first piezoelectric body 70A is formed only on the first lower electrode 60A, and the second piezoelectric body 70B is formed only on the second lower electrode 60B. Therefore, it is possible to prevent the first piezoelectric body 70A and the second piezoelectric body 70B from suffering from cracks and orientation disturbances that are likely to occur on end edges of the first lower electrode 60A and the second lower electrode 60B. In this configuration, the side surface of the first lower electrode 60A is exposed between the first piezoelectric body 70A and the vibrating plate 50, and the side surface of the second lower electrode 60B is exposed between the second piezoelectric body 70B and the vibrating plate 50. Therefore, by providing the insulating layer 150 that covers the side surface of the first lower electrode 60A and the side surface of the second lower electrode 60B, the common electrode 90 formed on the vibrating plate 50 can be electrically coupled to the first upper electrode 80A and the second upper electrode 80B without causing a short circuit to the first lower electrode 60A and the second lower electrode 60B.

Although the insulating layer 150 covers an entire side surface of the piezoelectric body 70 in the embodiment, the present disclosure is not limited to this configuration. If the insulating layer 150 is formed at least between the side surface of the lower electrode 60 and the common electrode 90, a short circuit between the common electrode 90 and the lower electrode 60 can be prevented. Therefore, the insulating layer 150 may be formed only on a part of the side surface of the lower electrode 60. The insulating layer 150 covers the side surface of the lower electrode 60, and may not cover the side surface of the piezoelectric body 70.

When the insulating layer 150 does not cover the side surface of the piezoelectric body 70, the piezoelectric actuator 2 may include a protective film that covers the side surface of the piezoelectric body 70 (the first piezoelectric body 70A and the second piezoelectric body 70B). As the protective film, for example, a nitride such as titanium nitride, silicon nitride, aluminum nitride, or TiAlN, an oxide such as aluminum oxide, titanium oxide, tantalum oxide, chromium oxide, iridium oxide, or hafnium oxide, a resin-based material such as parylene, an adhesive, or a photosensitive resist, or a carbon-based material such as diamond-like carbon can be used. By providing the protective film that covers the piezoelectric body 70, it is possible to effectively prevent entry of moisture into the piezoelectric body 70.

The protective substrate 30 is bonded to the vibrating plate 50 by an adhesive (not illustrated). The protective substrate 30 has a through hole 32 penetrating the protective substrate 30 in a thickness direction thereof (Z-axis direction).

The through hole 32 communicates with the third communication passage 15 via a through hole provided in the vibrating plate 50. The through hole 32 and the third communication passage 15 constitute the manifold 100 that serves as a common liquid chamber of the pressure chambers 12. The protective substrate 30 has another through hole 33 penetrating the protective substrate 30 in the Z-axis direction. An end of the lead electrode 55 is disposed in the through hole 33. The protective substrate 30 has an opening 31 that is open to the vibrating plate 50. The opening 31 is a space for not obstructing driving of the piezoelectric device 300. The opening 31 may be sealed or may not be sealed. The circuit substrate 120 is provided on the protective substrate 30. The circuit substrate 120 includes a semiconductor integrated circuit (IC) for driving the piezoelectric device 300. The circuit substrate 120 and the lead electrode 55 are electrically coupled to each other via a coupling wiring (not illustrated). The compliance substrate 40 is provided on the protective substrate 30. The compliance substrate 40 includes a sealing layer 41 provided on the protective substrate 30 and a fixing plate 42 provided on the sealing layer 41. The sealing layer 41 seals an upper opening of the through hole 32. The sealing layer 41 seals the manifold 100. The sealing layer 41 has, for example, flexibility. The fixing plate 42 has a through hole 43 penetrating the fixing plate 42 in the Z-axis direction. The through hole 43 overlaps with the manifold 100 as viewed from the Z-axis direction.

In the liquid droplet discharge head 1 of the embodiment, ink is taken in from an ink introduction port continuous to an external ink supply device (not illustrated), an inside of the liquid droplet discharge head 1 is filled with ink from the manifold 100 to the nozzle 21, and then a voltage is applied between the lower electrode 60 and the upper electrode 80 that are corresponding to each pressure chamber 12 in accordance with a recording signal from a drive circuit. Accordingly, the vibrating plate 50 is bent and deformed together with the piezoelectric device 300, a pressure in each pressure chamber 12 is increased, and ink droplets are ejected from the nozzles 21.

In the embodiment, the common electrode 90 overlaps only the end portion of the piezoelectric device 300. That is, the common electrode 90 is disposed in a region that does not overlap the pressure chamber 12 in a plan view. With such a configuration, since the common electrode 90 is not disposed in a region where the vibrating plate 50 is displaced by the piezoelectric device 300, deformation of the piezoelectric device 300 is not obstructed by the common electrode 90, and a large displacement amount can be obtained.

Figure 5:
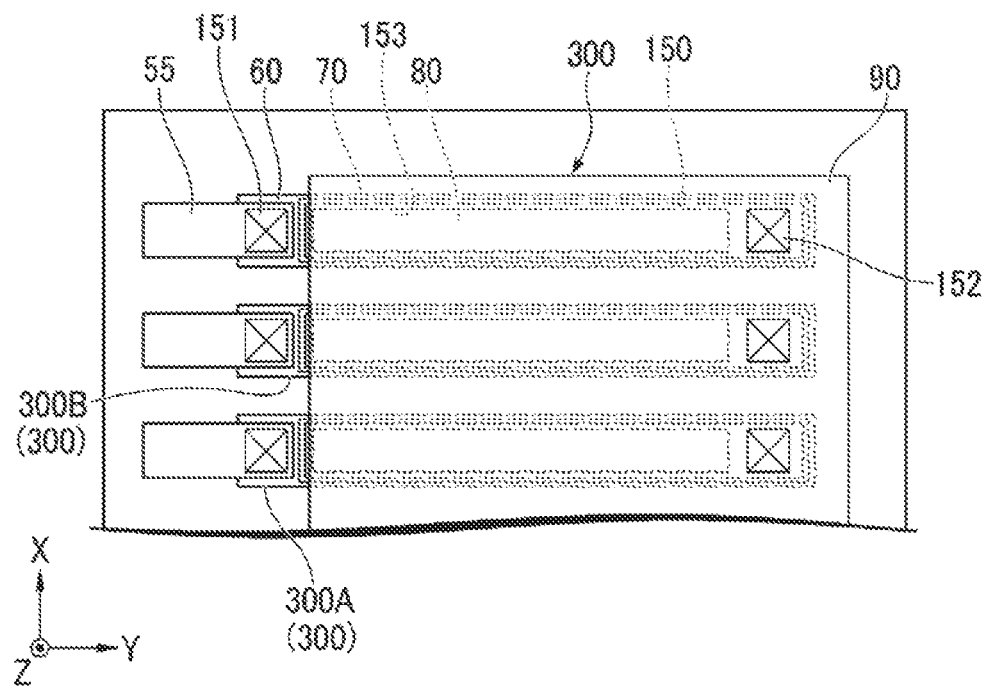
FIG. 5 is a diagram illustrating another configuration example of a common electrode.

The configuration of the common electrode 90 is not limited to the configuration of the embodiment. As illustrated in FIG. 5, the common electrode 90 may cover the piezoelectric body 70. In the configuration illustrated in FIG. 5, the common electrode 90 is also formed on the opening 153 of the insulating layer 150. In this example, the common electrode 90 and the upper electrode 80 are electrically coupled to each other at two positions, that is, the contact hole 152 and the opening 153. Any one of the contact hole 152 and the opening 153 may not be provided.

As illustrated in FIG. 5, since the common electrode 90 covers the piezoelectric body 70, it is possible to further prevent entry of moisture or the like into the piezoelectric body 70. In particular, in a configuration in which the side surface of the piezoelectric body 70 is not covered with the insulating layer 150, the common electrode 90 can also function as a protective film, and reliability of the piezoelectric actuator 2 can be improved.

The configuration illustrated in FIG. 5 is suitable for a case where the piezoelectric device 300 is not provided with the upper electrode 80. In a configuration in which the upper electrode 80 is not provided, when the common electrode 90 covering the piezoelectric body 70 is formed, the common electrode 90 functions as the upper electrode of each piezoelectric device 300.

The lead electrode 55 and the common electrode 90 need to be insulated from each other. Therefore, the common electrode 90 may not cover the piezoelectric body 70 in the vicinity of the lead electrode 55. In the example illustrated in FIG. 5, of the side surfaces of the piezoelectric body 70, a side surface facing a lead electrode 55 side (−Y-axis direction) is not covered with the common electrode 90. However, since an end portion of the piezoelectric body 70 located in the vicinity of the lead electrode 55 is a portion that does not overlap the pressure chamber 12 in a plan view, the end portion hardly contributes to a vibration operation of the vibrating plate 50. Therefore, even if some moisture enters the piezoelectric body 70 in the vicinity of the lead electrode 55, the performance of the piezoelectric device 300 is not affected. That is, the common electrode 90 may cover at least a portion of the piezoelectric body 70 overlapping the pressure chamber 12 in a plan view.

Figure 6:
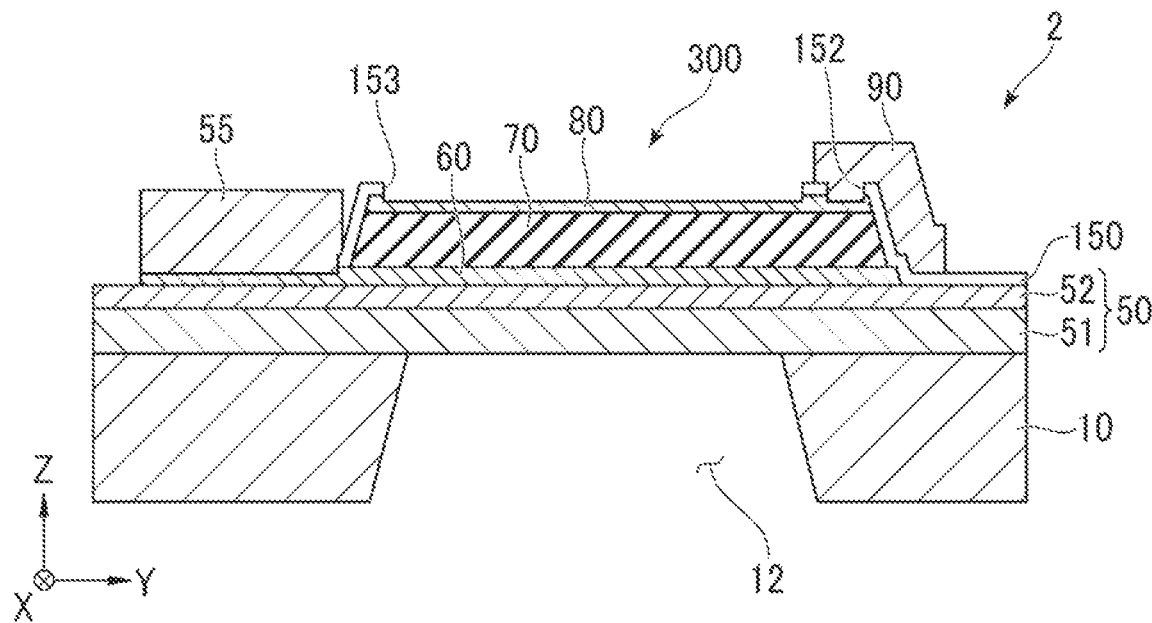
FIG. 6 is a diagram illustrating another configuration example of a lower electrode and a lead electrode.

In the embodiment, the lead electrode 55 and the lower electrode 60 are coupled to each other via the contact hole 151, but the present disclosure is not limited to this configuration. For example, a configuration illustrated in FIG. 6 may be employed. In the example illustrated in FIG. 6, the lower electrode 60 includes a wiring portion 60a that extends to greatly protrude in the −Y-axis direction with respect to the piezoelectric body 70. The wiring portion 60a of the lower electrode 60 is not covered with the insulating layer 150. The lead electrode 55 is formed in contact with an upper surface of the wiring portion 60a of the lower electrode 60. With such a configuration, a contact area between the lower electrode 60 and the lead electrode 55 can be increased. Accordingly, reliability of electrical coupling between the lead electrode 55 and the lower electrode 60 can be improved, and an electrical resistance of a wiring coupled to the piezoelectric device 300 can be reduced.

Manufacturing Method

FIGS. 7 to 11 are cross-sectional views illustrating a manufacturing method of the liquid droplet discharge head of the above embodiment. Cross sections shown in the drawings are cross sections at a position along a line XI-XI in FIG. 2.

Figure 7:
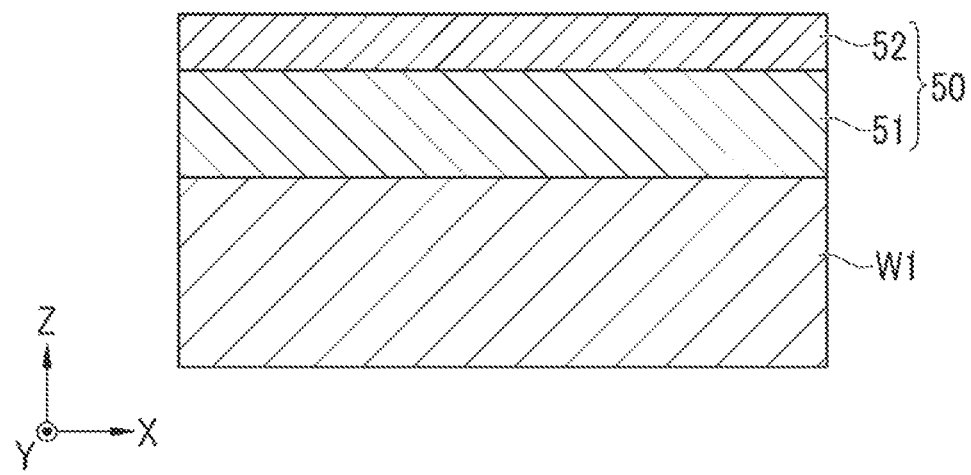
FIG. 7 is a cross-sectional view illustrating a manufacturing method of the liquid droplet discharge head according to the embodiment.

First, a silicon substrate W1 illustrated in FIG. 7 is prepared.

Next, the vibrating plate 50 is formed on a top surface of the silicon substrate W1. In forming the vibrating plate 50, first, the silicon substrate W1 is thermally oxidized to form the silicon oxide layer 51 made of silicon dioxide.

Next, the zirconium oxide layer 52 made of zirconium oxide (ZrOx) is formed on the silicon oxide layer 51 by a liquid phase method. In forming the zirconium oxide layer 52, first, a metal alkoxide or a metal carboxylate and a thickener are added to a carboxylic acid, then water ($H_2O$) is added thereto, and the mixture is heated and stirred at about 70° C. for about 2 hours to obtain a uniform and transparent precursor solution. The precursor solution is coated on the silicon substrate W1 by a spin coating method (coating step). Next, the solution coated on the silicon substrate W1 is heated to a temperature in a range from 160° C. to 200° C. and dried for about 5 minutes to obtain a dried film (drying step). Then, the dried film is heated to a temperature in a range from 375° C. to 415° C. and held for about 5 minutes at this temperature to be degreased (degreasing step). When a thicker zirconium oxide layer 52 is desired to be obtained, after the degreasing step, the process may return to the first coating step, and then the drying step and the degreasing step may be repeatedly performed. After the degreasing step, the dried film is heated to a temperature in a range from 750° C. to 850° C. and held for about 10 seconds to 3 minutes at this temperature to be crystallized (preliminary sintering step). When a further thicker zirconium oxide layer 52 is desired to be obtained, after the preliminary sintering step, the process may return to the first coating step, and then the drying step, the degreasing step, and the preliminary sintering step may be repeatedly performed. Then, after the preliminary sintering step, the dried film is heated to a temperature in a range from 800° C. to 950° C. and held for about 1 hour at this temperature, thereby forming the zirconium oxide layer 52 (final sintering step). Examples of a heating device used in the drying step, the degreasing step, the preliminary sintering step, and the final sintering step include a rapid thermal annealing (RTA) device that performs heating by irradiation with infrared from an infrared lamp, and a hot plate.

Figure 8:
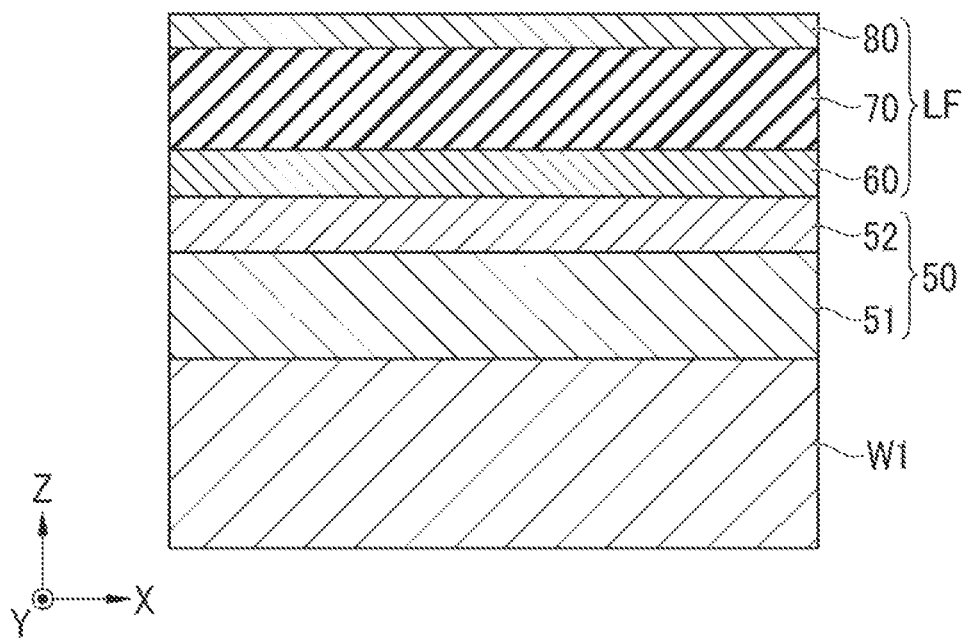
FIG. 8 is a cross-sectional view illustrating the manufacturing method of the liquid droplet discharge head according to the embodiment.

Next, as illustrated in FIG. 8, the lower electrode 60 is formed on an entire surface of the vibrating plate 50. Although a material of the lower electrode 60 is not particularly limited, it is necessary that the lower electrode 60 is a material whose conductivity does not disappear due to oxidation at the time of heat treatment (generally, 500° C. or higher) in forming the piezoelectric body 70, diffusion of a material contained in the piezoelectric body 70, or the like.

For this reason, as the material of the lower electrode 60, a metal such as platinum or iridium, a conductive oxide such as iridium oxide or lanthanum nickel oxide, or a laminated material of these materials, which does not lose conductivity even at a high temperature, is preferably used. The lower electrode 60 can be formed by, for example, vapor phase deposition such as a sputtering method, a physical vapor deposition method (PVD method), or a laser ablation method, or liquid phase deposition such as a spin coating method. An adhesion layer for securing an adhesive force may be used between the above-described conductive material and the vibrating plate 50. In the embodiment, although not particularly illustrated, titanium is used as the adhesion layer. As the adhesion layer, zirconium, titanium, titanium oxide, or the like can be used. A deposition method of the adhesion layer is the same as that of the electrode material. In addition, a control layer for controlling crystal growth of the piezoelectric body 70 may be formed at an electrode top surface (deposition side of the piezoelectric body 70). In the embodiment, titanium is used for crystal control of the piezoelectric body 70 (PZT). Titanium is taken into the piezoelectric body 70 at the time of deposition of the piezoelectric body 70, and thus is not provided as a film after the piezoelectric body 70 is formed. As the crystal control layer, a conductive oxide having a perovskite crystal structure such as lanthanum nickel oxide may be used. A deposition method of the crystal control layer is the same as that of the electrode material. It is desirable that an insulating crystal control layer does not exist between the piezoelectric body 70 and the lower electrode 60 after the piezoelectric body 70 is formed. This is because the crystal control layer and a capacitor of the piezoelectric body 70 are coupled in series, and thus an electric field applied to the piezoelectric body 70 decreases. As in the embodiment, since titanium is used as an orientation control layer, although the orientation control layer is subjected to heat treatment by which the orientation control layer would originally turn into an oxide (insulator), the orientation control layer is not provided as a film because the orientation control layer is taken into the piezoelectric body 70.

Next, in the embodiment, the piezoelectric body 70 made of lead zirconate titanate (PZT) is formed. Here, in the embodiment, the piezoelectric body 70 is formed using a so-called sol-gel method. In the sol-gel method, a so-called sol in which a metal complex is dissolved and dispersed in a solvent is applied and dried to be gelled, and further sintered at a high temperature to obtain the piezoelectric body 70 made of a metal oxide. A manufacturing method of the piezoelectric body 70 is not limited to the sol-gel method, and for example, a metal-organic decomposition (MOD) method or a physical vapor deposition (PVD) method such as a sputtering method and a laser ablation method may be used. That is, the piezoelectric body 70 may be formed by either a liquid phase method or a vapor phase method. Alternatively, the piezoelectric body 70 may be formed by laminating a plurality of thin piezoelectric films.

The piezoelectric body 70 is formed on the lower electrode 60 that is not patterned. When the piezoelectric body 70 is to be formed after patterning the lower electrode 60, since the lower electrode 60 is patterned by a photo process, ion milling, and asking, a top surface of the lower electrode 60, a seed crystal layer such as titanium (not illustrated) provided at the top surface, or the like may deteriorate. As a result, even if the piezoelectric body 70 is formed on the deteriorated surface, it is less likely to obtain the piezoelectric body 70 having good crystallinity. In contrast, when the piezoelectric body 70 is formed without patterning the lower electrode 60, the top surface of the lower electrode 60 does not deteriorate, and thus the piezoelectric body 70 having good crystallinity over the entire surface can be formed. In addition, since the piezoelectric body 70 and the vibrating plate 50 are not in contact with each other, diffusion of a component contained in the piezoelectric body 70 such as lead (Pb) or bismuth (Bi) into the vibrating plate 50 is also prevented.

Next, the upper electrode 80 is formed on the piezoelectric body 70. As a material of the upper electrode 80, a metal such as platinum or iridium, a conductive oxide such as iridium oxide or lanthanum nickel oxide, or a laminated material of these materials, which does not lose conductivity even at a high temperature, is preferably used. As a deposition method of the upper electrode 80, the same deposition method as that of the lower electrode 60 can be used.

The upper electrode 80 is formed on the piezoelectric body 70 that is not patterned. Since deterioration of a top surface of the piezoelectric body 70 due to a patterning step does not occur, the upper electrode 80 having good crystallinity over the entire surface can be formed on the piezoelectric body 70.

By the above-described steps, a laminated film LF in which the lower electrode 60, the piezoelectric body 70, and the upper electrode 80 are laminated in this order is formed on the vibrating plate 50.

Figure 9:
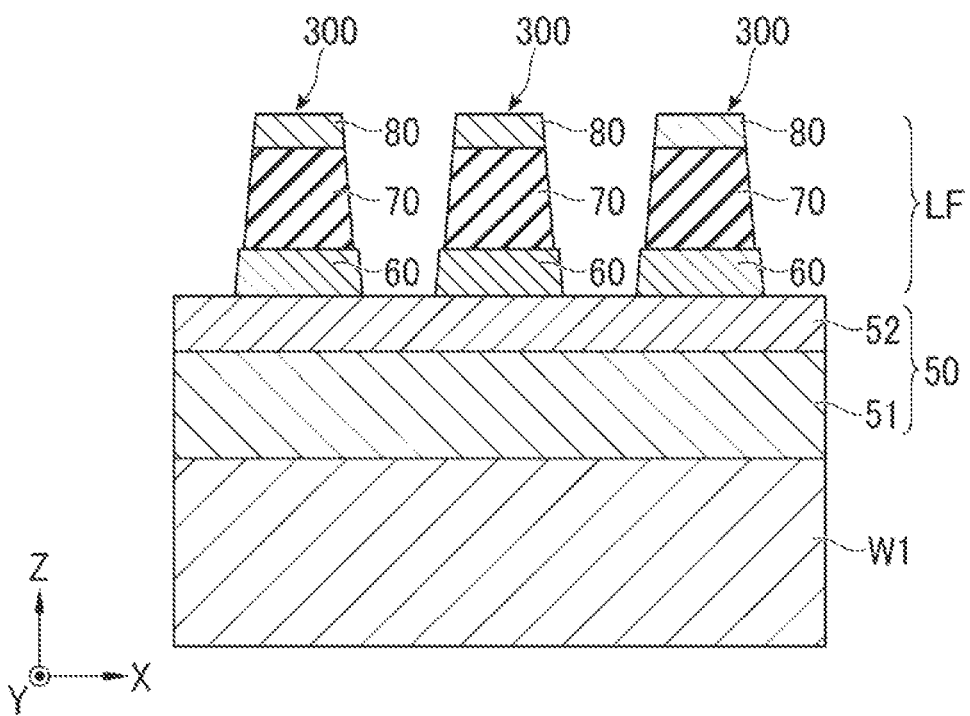
FIG. 9 is a cross-sectional view illustrating the manufacturing method of the liquid droplet discharge head according to the embodiment.

Next, as illustrated in FIG. 9, the laminated film LF including the lower electrode 60, the piezoelectric body 70, and the upper electrode 80 is collectively patterned. The patterning of the laminated film LF can be performed by dry etching such as reactive ion etching (RIE) or ion milling, for example. The patterning of the laminated film LF may be performed by photolithography or wet etching using an etching solution, if possible. At a portion where the lower electrode 60 protrudes further in the −Y-axis direction than the piezoelectric body 70 illustrated in FIGS. 2 and 3, the piezoelectric body 70 and the upper electrode 80 on the lower electrode 60 are selectively removed by etching or ion milling. By this patterning step, a plurality of piezoelectric devices 300 arranged apart from each other are formed on the vibrating plate 50.

The piezoelectric device 300 formed by the manufacturing method of the embodiment is manufactured by collectively patterning the laminated film LF. Therefore, the side surfaces of the lower electrode 60, the piezoelectric body 70, and the upper electrode 80 are exposed as side surfaces of the piezoelectric device 300. That is, the side surface of the lower electrode 60 is not covered with the piezoelectric body 70. The side surface of the piezoelectric body 70 is not covered with the upper electrode 80.

Figure 10:
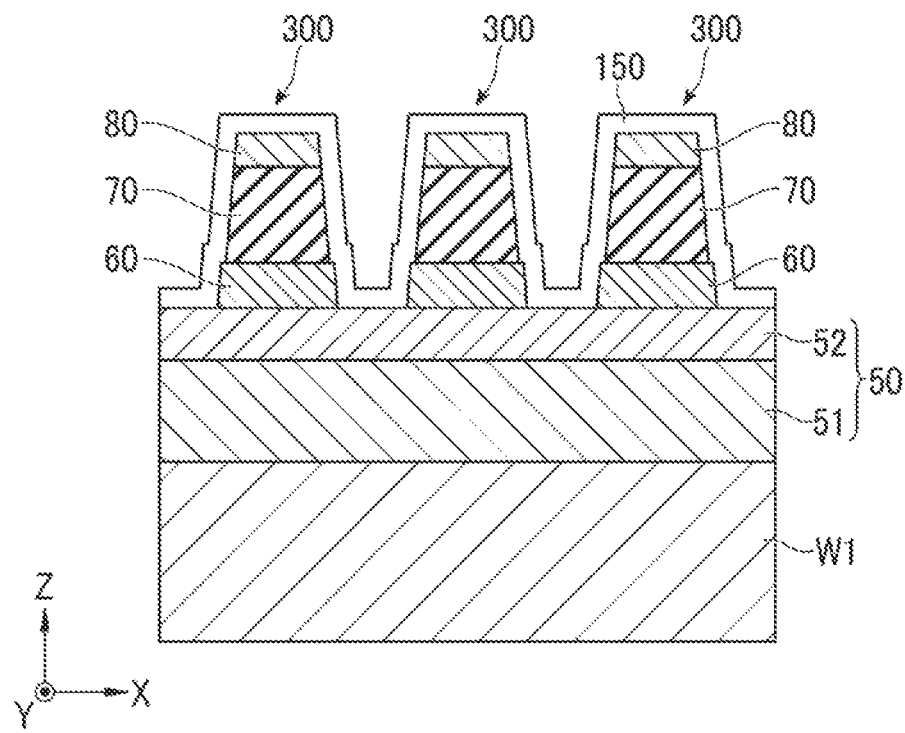
FIG. 10 is a cross-sectional view illustrating the manufacturing method of the liquid droplet discharge head according to the embodiment.

Next, as illustrated in FIG. 10, the insulating layer 150 is formed over one surface side (a surface side on which the laminated film LF is formed) of the silicon substrate W1. The insulating layer 150 covers top surfaces of the plurality of piezoelectric devices 300 and a top surface of the vibrating plate 50 where the piezoelectric devices 300 are not formed. As a deposition method of the insulating layer 150, a vapor phase deposition method including a PVD method such as a sputtering method or a laser ablation method and a CVD method, or a liquid phase deposition method such as a sol-gel method can be used.

Figure 11:
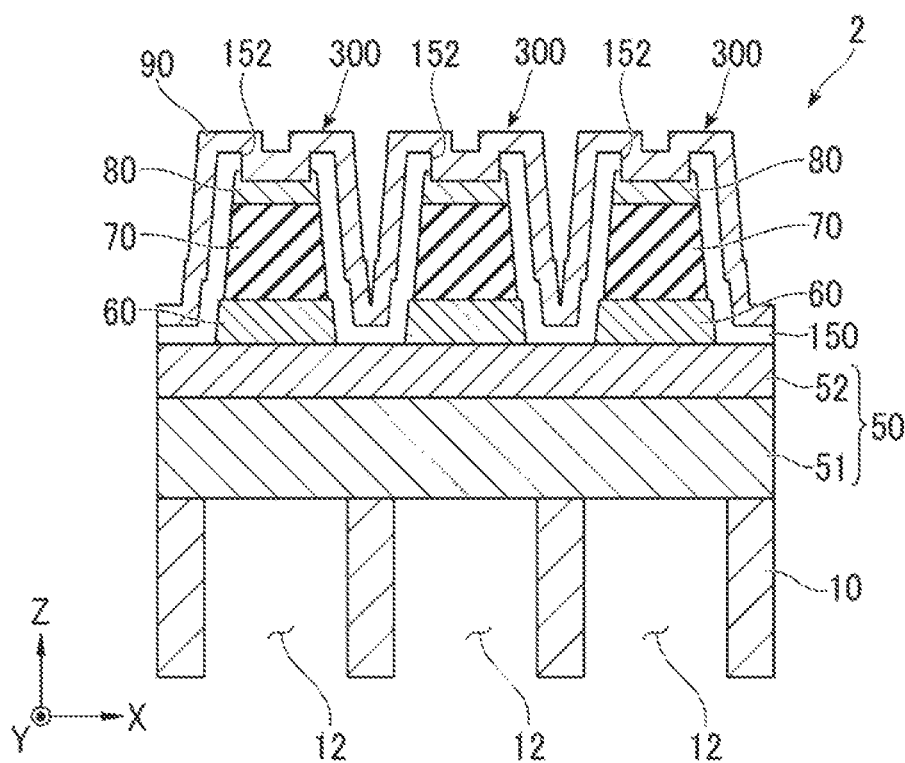
FIG. 11 is a cross-sectional view illustrating the manufacturing method of the liquid droplet discharge head according to the embodiment.

Next, as illustrated in FIG. 11, the insulating layer 150 is partially removed to form the contact holes 151 and 152 and the opening 153 illustrated in FIG. 2. The patterning of the insulating layer 150 can be performed by a photolithography method.

Next, the common electrode 90 coupled to the upper electrode 80 via the contact hole 152 and the lead electrode 55 (see FIG. 2) coupled to the lower electrode 60 via the contact hole 151 are patterned on the vibrating plate 50.

Next, as illustrated in FIG. 11, the silicon substrate W1 is patterned. Specifically, a mask film (not illustrated) is formed on a surface of the silicon substrate W1 opposite from the vibrating plate 50, and then anisotropic etching (wet etching) using an alkaline solution of KOH or the like is performed through the mask film to form the pressure chambers 12 corresponding to the piezoelectric devices 300, thereby forming the channel substrate 10. By the above steps, the piezoelectric actuator 2 of the embodiment is manufactured.

Thereafter, the nozzle plate 20 having the nozzles 21 is bonded to a surface of the channel substrate 10 opposite from the vibrating plate 50. In addition, when the protective substrate 30 and the compliance substrate 40 that are separately manufactured are bonded, the liquid droplet discharge head of the embodiment is formed.

According to the manufacturing method of the embodiment described above, since the piezoelectric body 70 is formed on the lower electrode 60 that is not patterned, the top surface of the lower electrode 60 does not deteriorate in the patterning step, and the piezoelectric body 70 having good crystallinity over the entire surface can be formed. Then, by collectively patterning the lower electrode 60, the piezoelectric body 70, and the upper electrode 80, all of the piezoelectric bodies 70 of the plurality of piezoelectric devices 300 become piezoelectric bodies having good crystallinity. It is possible to manufacture the piezoelectric actuator 2 including the piezoelectric device 300 having excellent displacement characteristics.

In addition, when the piezoelectric body 70 is formed on the lower electrode 60 that is patterned, the crystallinity of the piezoelectric body 70 formed on the lower electrode 60 and the crystallinity of the piezoelectric body 70 formed on the vibrating plate 50 are different from each other, and cracks may be generated in the piezoelectric body 70 on an end edge of the lower electrode 60, or a region in which the crystallinity is disturbed may be formed. According to the manufacturing method of the embodiment, it is possible to prevent cracks and disturbance in crystallinity of the piezoelectric body 70.

When the liquid droplet discharge head 1 of the embodiment is not provided with the upper electrode 80, a depositing step of the upper electrode 80 is omitted in the manufacturing method described above. In the patterning step, the laminated film LF including the lower electrode 60 and the piezoelectric body 70 is patterned, and thereafter the common electrode 90 is formed on the piezoelectric body 70. In the configuration in which the upper electrode 80 is not provided, as illustrated in FIG. 5, it is preferable to form the common electrode 90 that covers the piezoelectric body 70.

Printer

Figure 12:
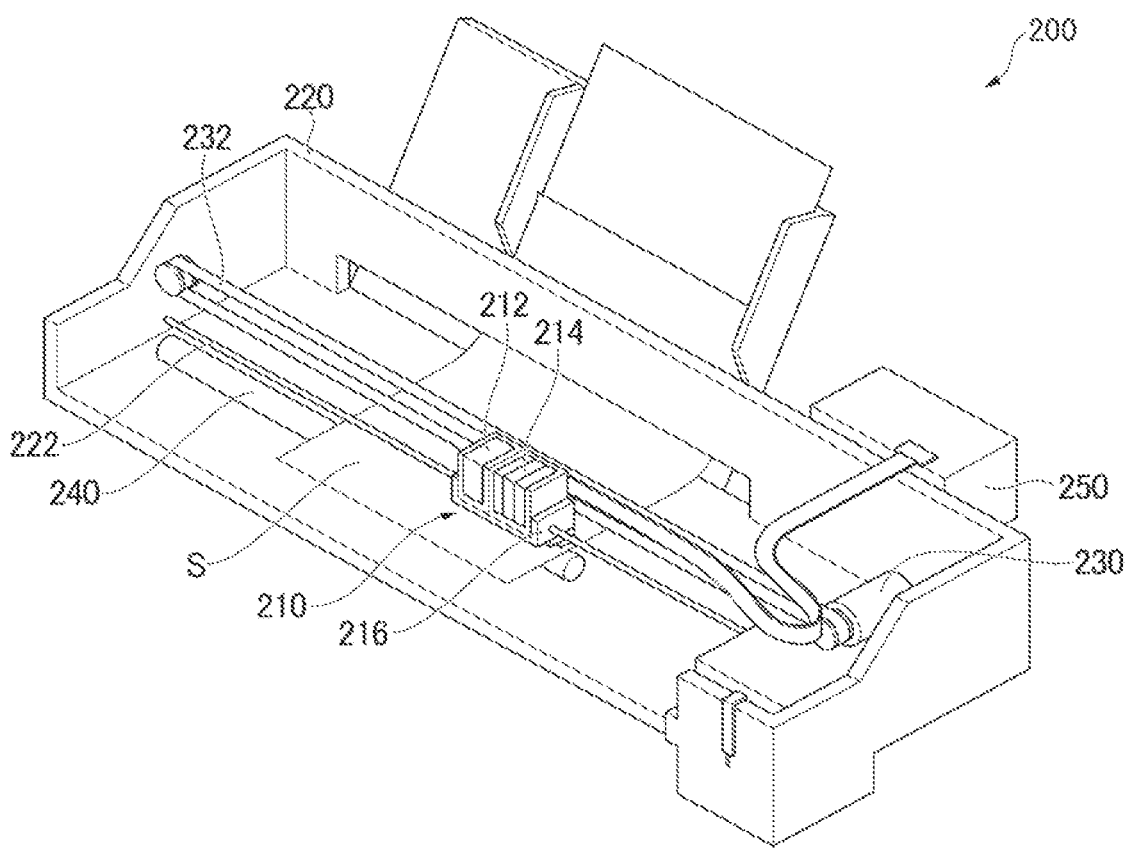
FIG. 12 is a perspective view schematically illustrating a printer according to the embodiment.

Next, a printer according to the embodiment will be described with reference to the drawings. FIG. 12 is a perspective view schematically illustrating a printer 200 according to the embodiment.

The printer 200 is an inkjet printer. As illustrated in FIG. 12, the printer 200 includes a head unit 210. The head unit 210 includes, for example, the liquid droplet discharge head 1. The number of the liquid droplet discharge heads 1 is not particularly limited. The head unit 210 is detachably provided with cartridges 212 and 214 that constitute a supply unit. A carriage 216 on which the head unit 210 is mounted is movable in an axial direction on a carriage shaft 222 attached to a device main body 220, and discharges a liquid supplied from a liquid supply unit.

Here, the liquid may be a material in a state where a substance is in a liquid phase, and the liquid also includes a material in a liquid state such as a sol or a gel. In addition, the liquid includes not only a liquid as one state of a substance, but also a composition that is obtained by dissolving, dispersing or mixing particles of a functional material formed of a solid such as a pigment or a metal particle in a solvent. Typical examples of the liquid include an ink and a liquid crystal emulsifier. The ink includes various liquid compositions such as a general water-based ink, an oil-based ink, a gel ink, and a hot melt ink.

In the printer 200, a driving force of a drive motor 230 is transmitted to the carriage 216 via a plurality of gears (not illustrated) and a timing belt 232, whereby the carriage 216 on which the head unit 210 is mounted is moved along the carriage shaft 222. On the other hand, the device main body 220 is provided with a conveying roller 240 as a conveyance mechanism that moves a sheet S, which is a recording medium such as paper, relative to the liquid droplet discharge head 1. The conveyance mechanism for conveying the sheet S is not limited to the conveying roller, and may be a belt, a drum, or the like.

The printer 200 includes a printer controller 250 as a control unit that controls the liquid droplet discharge head 1 and the conveying roller 240. The printer controller 250 is electrically coupled to the circuit substrate 120 of the liquid droplet discharge head 1. The printer controller 250 includes, for example, a random access memory (RAM) that temporarily stores various types of data, a read only memory (ROM) that stores a control program and the like, a central processing unit (CPU), and a drive signal generation circuit that generates a drive signal to be supplied to the liquid droplet discharge head 1.

Ultrasonic Device

Figure 13:
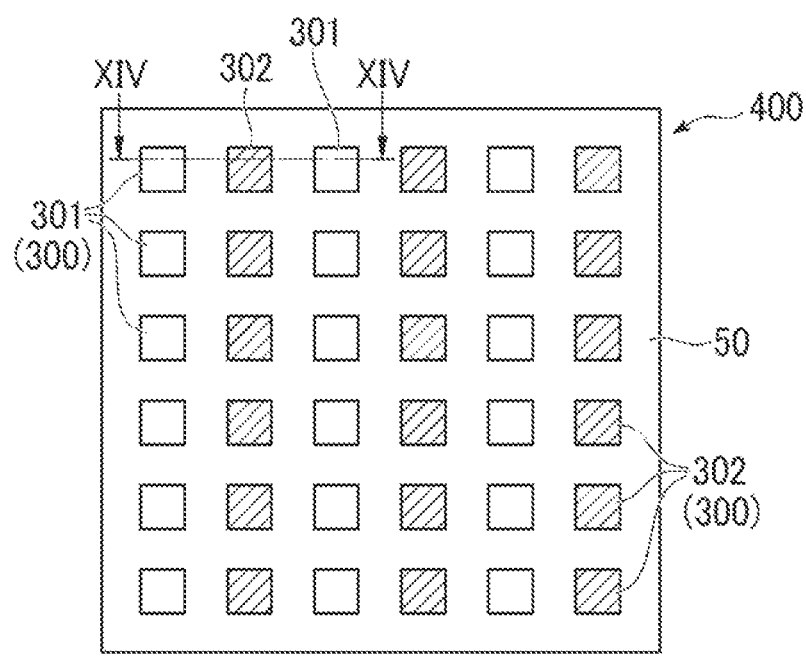
FIG. 13 is a plan view of an ultrasonic device in which a piezoelectric device of the embodiment is mounted as an ultrasonic transducer.
Figure 14:
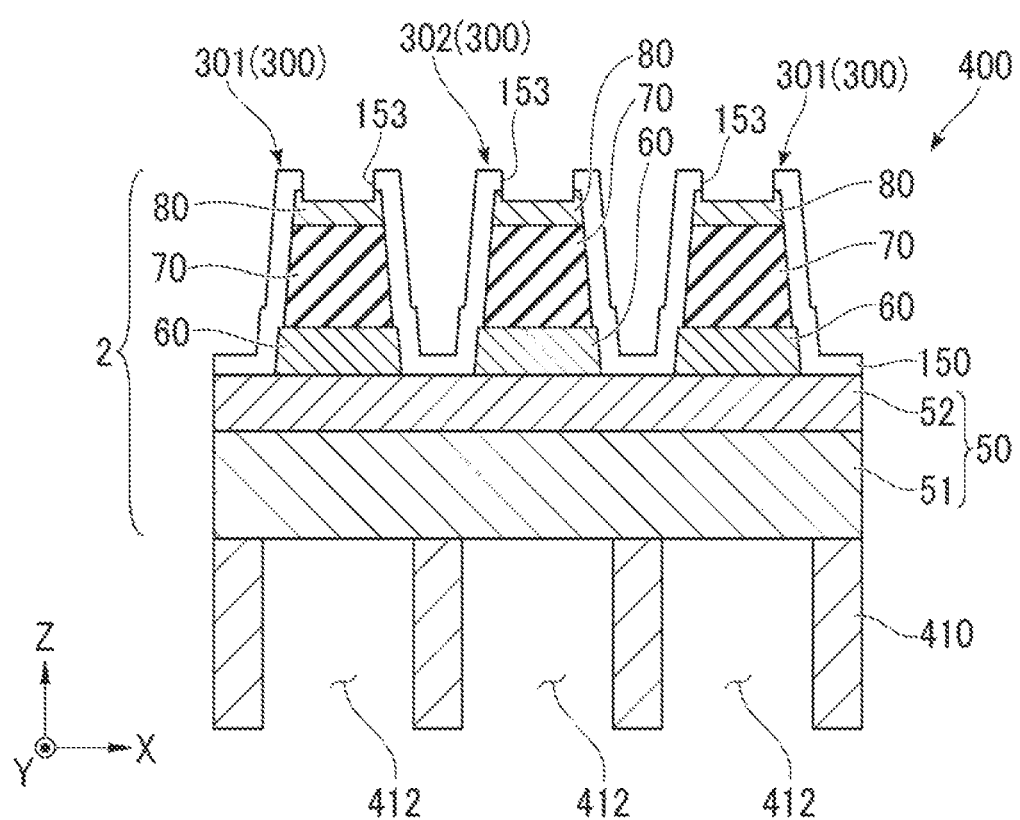
FIG. 14 is a partial cross-sectional view taken along a line XIV-XIV in FIG. 13.

FIG. 13 is a plan view of an ultrasonic device in which the piezoelectric device of the above embodiment is mounted as an ultrasonic transducer. FIG. 14 is a partial cross-sectional view taken along a line XIV-XIV in FIG. 13. In the embodiment, transmission and reception of ultrasonic waves are performed by using an electroacoustic transducer that uses a piezoelectric effect. The electroacoustic transducer is the piezoelectric device 300. At the time of transmission of ultrasonic waves, the electroacoustic transducer converts electric energy into mechanical energy (uses an inverse piezoelectric effect), and changes due to contraction and extension of the piezoelectric layer excite the vibrating plate to vibrate, thereby transmitting ultrasonic waves. Therefore, in this case, the piezoelectric device 300 is a transmission ultrasonic transducer 301.

Further, in order to receive ultrasonic waves reflected from an object to be detected, mechanical energy is converted into electric energy (positive piezoelectric effect is used), and the electric energy is generated by deformation of the piezoelectric body, and a signal of the electric energy is detected. Therefore, in this case, the piezoelectric device 300 is a reception ultrasonic transducer 302.

As illustrated in FIGS. 13 and 14, a plurality of transmission ultrasonic transducers 301 and a plurality of reception ultrasonic transducers 302 are provided in an array on an opening substrate 410 having a plurality of openings 412, and constitute an ultrasonic device 400 (array sensor). Columns of the plurality of transmission ultrasonic transducers 301 and columns of the plurality of reception ultrasonic transducers 302 are alternately arranged, and energization is switched for each column of the transducers. Line scanning and sector scanning are implemented according to the switching of the energization. Further, levels of output and input of ultrasonic waves are determined according to the number of the transducers to be energized and the number of the columns. In the drawing, 6 rows×6 columns are drawn without being illustrated. The number of rows and the number of columns of the array are determined according to spread of a scan range.

As transducers, the transmission ultrasonic transducer 301 and the reception ultrasonic transducer 302 can be arranged alternately one by one. In this case, by using an ultrasonic wave transmission and reception source in which central axes of the transmission side and the reception side are aligned with each other, it is easy to align directional angles of transmission and reception.

In FIG. 14, the vibrating plate 50 is formed on an upper surface of the opening substrate 410 (on a piezoelectric body 70 side). The plurality of openings 412 are formed in the opening substrate 410. The opening 412 can be formed by a processing method such as etching, polishing, or laser processing depending on a substrate material. Since the lower electrode 60, the piezoelectric body 70, and the upper electrode 80 are the same as those of the above-described embodiment, a description of configurations thereof will be omitted. Although not illustrated in the drawing, the common electrode 90 is coupled to the upper electrode 80 in the same manner as in the above-described embodiment. The common electrode 90 is preferably disposed in a region that does not overlap the opening 412 in a plan view. With this configuration, the deformation of the piezoelectric device 300 is not obstructed, and the ultrasonic device including the ultrasonic transducer having excellent deformation characteristics is obtained.

In contrast to the previous embodiment, since the ultrasonic device needs to be driven in a higher frequency region than the liquid droplet discharge head 1, configurations and physical property values such as thickness and the Young's modulus of the piezoelectric body 70, the vibrating plate 50, the electrode materials, and the opening substrate 410 may be adjusted.

Further, wirings (not illustrated) are coupled to the transmission ultrasonic transducer 301 and the reception ultrasonic transducer 302, and each wiring is coupled to a terminal portion (not illustrated) of a control board (not illustrated) via a flexible printed wiring board (not illustrated). The control board is provided with a control unit (not illustrated) that includes a calculation unit, a storage unit, and the like. The control unit controls an input signal input to the transmission ultrasonic transducer 301 and processes an output signal output from the reception ultrasonic transducer 302.

As described above, according to the ultrasonic device 400 of the embodiment, the piezoelectric devices 300 manufactured by using a MEMS technology can be arranged at a narrower pitch (high resolution) and have a lower drive voltage as compared with a sensor using bulk type piezoelectric ceramics or the like. Accordingly, effects in reducing size, thickness and energy consumption of the ultrasonic device and a device equipped with the ultrasonic device are presented. In addition, since variation in manufacturing of the piezoelectric devices 300 is small, an effect in increasing recognition accuracy is also presented. Furthermore, by reducing a film thickness of the piezoelectric body 70, the displacement characteristics can be improved, and efficiency of transmission and reception of ultrasonic waves can be improved.

What is claimed is:

1. A piezoelectric actuator for changing a volume of a first pressure chamber and a second pressure chamber, comprising:
   a substrate;
   a first piezoelectric device for changing the volume of the first pressure chamber and a second piezoelectric device for changing the volume of the second pressure chamber formed at the substrate, the first piezoelectric device including a first lower electrode formed at the substrate, a first piezoelectric body formed at the first lower electrode, and a first upper electrode formed at the first piezoelectric body, the second piezoelectric device including a second lower electrode formed at the substrate in a region different from the first lower electrode, a second piezoelectric body formed at the second lower electrode, and a second upper electrode formed at the second piezoelectric body;
   a common electrode formed at the substrate and coupled to the first upper electrode and the second upper electrode; and
   an insulating layer located between the common electrode and the first lower electrode and between the common electrode and the second lower electrode,
   wherein
   a side surface of the first lower electrode is not covered with the first piezoelectric body,
   a side surface of the second lower electrode is not covered with the second piezoelectric body, and
   in a direction in which the first piezoelectric device and the second piezoelectric device are arranged, a width of the first lower electrode is less than a width of the first pressure chamber, and a width of the second lower electrode is less than a width of the second pressure chamber.

2. The piezoelectric actuator according to claim 1, wherein
   the common electrode covers each of the first piezoelectric body and the second piezoelectric body.

3. The piezoelectric actuator according to claim 1, further comprising:
   a protective film covering each of the first piezoelectric body and the second piezoelectric body.

4. A liquid droplet discharge head comprising:
   a nozzle plate having a nozzle configured to discharge a liquid;
   a channel substrate provided at the nozzle plate and having a pressure chamber continuous with the nozzle; and
   the piezoelectric actuator according to claim 1 provided at the channel substrate.

5. The liquid droplet discharge head according to claim 4, wherein
   as viewed from a lamination direction of the channel substrate and the piezoelectric actuator, the common electrode of the piezoelectric actuator is disposed at a position not overlapping the pressure chamber.

6. An ultrasonic device comprising:
   an opening substrate having an opening; and
   the piezoelectric actuator according to claim 1 provided at the opening substrate.

7. The ultrasonic device according to claim 6, wherein
   as viewed from a lamination direction of the opening substrate and the piezoelectric actuator, the common electrode of the piezoelectric actuator is disposed at a position not overlapping the opening.

\* \* \* \* \*